(12) United States Patent
Li

(10) Patent No.: US 10,672,675 B2
(45) Date of Patent: Jun. 2, 2020

(54) CIRCUIT AND METHOD FOR TESTING GATE LINES OF ARRAY SUBSTRATE

(71) Applicant: Wuhan China Star Optoelectronics Technology Co., Ltd., Wuhan, Hubei (CN)

(72) Inventor: Anshi Li, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 26 days.

(21) Appl. No.: 15/523,081

(22) PCT Filed: Mar. 14, 2017

(86) PCT No.: PCT/CN2017/076555
§ 371 (c)(1),
(2) Date: Aug. 2, 2018

(87) PCT Pub. No.: WO2018/152884
PCT Pub. Date: Aug. 30, 2018

(65) Prior Publication Data
US 2018/0331001 A1     Nov. 15, 2018

(30) Foreign Application Priority Data
Feb. 24, 2017 (CN) .............................. 201710103693

(51) Int. Cl.
*H01L 21/66* (2006.01)
*G02F 1/1362* (2006.01)
*G02F 1/1345* (2006.01)

(52) U.S. Cl.
CPC .......... *H01L 22/34* (2013.01); *G02F 1/13454* (2013.01); *G02F 1/136286* (2013.01); *G02F 2001/136254* (2013.01)

(58) Field of Classification Search
CPC ...... H01L 27/0251; H01L 22/32; G09G 3/006
See application file for complete search history.

(56) References Cited

U.S. PATENT DOCUMENTS

2007/0080905 A1*  4/2007  Takahara ............. G09G 3/3233
                                                      345/76
2012/0319992 A1* 12/2012  Lee ........................ G06F 3/044
                                                      345/174
(Continued)

FOREIGN PATENT DOCUMENTS

CN      103208264 A      7/2013
CN      105070239 A     11/2015

*Primary Examiner* — Christopher P McAndrew
*Assistant Examiner* — Zannatul Ferdous

(57) ABSTRACT

Related to is a gate on array. A circuit for testing a gate line of an array substrate includes: a test pad and a first switch unit which connects the test pad and the gate line and has an end connected to a control terminal. A voltage is applied to the control terminal to control activation and deactivation of the first switch unit. The gate line is in normal operation when the first switch unit is deactivated, and the test pad tests a signal of the gate line when the first switch unit is activated. In normal display, the first switch unit is deactivated, and the gate line is in normal operation. This can avoid influences of an additional load, which would otherwise cause abnormal display of a picture. In a manufacturing procedure, explosive wound caused by electrostatic discharge of the test pad can be prevented. When a display device cannot be lit, an external voltage can be introduced to activate the first switch unit, so as to detect a signal of the gate line.

8 Claims, 5 Drawing Sheets

(56) References Cited

U.S. PATENT DOCUMENTS

| | | |
|---|---|---|
| 2015/0022211 A1 | 1/2015 | Du et al. |
| 2015/0213762 A1* | 7/2015 | Xia ............... G09G 3/3266 345/215 |
| 2015/0340102 A1* | 11/2015 | Qian ............... G11C 19/184 377/54 |
| 2016/0196773 A1 | 7/2016 | Liu et al. |
| 2017/0092209 A1 | 3/2017 | Cao |

* cited by examiner

CIRCUIT AND METHOD FOR TESTING GATE LINES OF ARRAY SUBSTRATE

CROSS-REFERENCE TO RELATED APPLICATIONS

The present application claims the priority of Chinese patent application CN 201710103693.0, entitled "Circuit and method for testing gate lines of array substrate" and filed on Feb. 24, 2017, the entirety of which is incorporated herein by reference.

FIELD OF THE INVENTION

The present disclosure relates to a gate on array, and particularly, to a circuit and a method for testing gate lines of an array substrate.

BACKGROUND OF THE INVENTION

With the increasingly vigorous development of electronic goods market, the demand for liquid crystal display panels is also growing. This demand is caused because many electronic products use liquid crystal display devices (LCDs), such as TV screens, computer screens, and mobile phone screens. At present, a-Si TFT-LCDs have been replaced by LTPS TFT-LCDs. The LIPS technology has the advantage of high electron mobility, and is thus very suitable for the production of high-resolution display devices. However, a current LIPS process includes more than 10 procedures, far more complex than an a-Si process, and costs are also correspondingly increased. Therefore, it is very important to obtain a working state of a whole panel after an array substrate is manufactured. In addition, it is also essential to measure output of a gate on array (GOA) after the array substrate is manufactured due to wide application of a design of the GOA.

A plurality of detection steps is necessary before the LCD panel is lit. However, even after multi-detection, there is still a situation that some liquid crystal display panels cannot be lit. In this regard, destructive testing will be necessary for the array substrate of the liquid crystal display panel. An output waveform of the GOA is measured to find the problem, so as to avoid reoccurrence of a same problem.

In the prior art, as shown in FIG. 1, a method of detecting an array substrate in a liquid crystal display panel which cannot be lit is mainly performed as follows. A gate line 11 and a test pad 12 in a GOA unit around a display region 13 are electrically connected to each other by means of an electrical lead 10, and the test pad 12 is used to test an output waveform of the gate line 11. In this test method, since the gate line 11 and the test pad 12 are directly connected together by the electrical lead 10, the GOA is susceptible to static electricity during a manufacturing procedure of the array substrate, and even electrostatic wound occurs. And during the display of the liquid crystal display panel, as the GOA is electrically connected to the test pad, the screen is easily affected by additional loads, thereby causing abnormal display of a picture. Therefore, it becomes a technical problem to be solved urgently as to what kind of circuit can be used to test the GOA, and meanwhile to prevent static electricity from affecting the GOA in the manufacturing procedure of the array substrate and prevent an additional load from exerting an effect in a display procedure of the array substrate.

SUMMARY OF THE INVENTION

In view of the technical problem existing in the prior art as described above, the present disclosure provides a circuit and a method for testing a gate line of an array substrate.

The circuit for testing a gate line of an array substrate of the present disclosure comprises: a test pad; and a first switch unit which connects the test pad and the gate line and has an end connected to a control terminal. A voltage is applied to the control terminal to control activation and deactivation of the first switch unit. The gate line is in normal operation when the first switch unit is deactivated, and the test pad tests an output signal of the gate line when the first switch unit is activated.

According to the circuit for testing a gate line of an array substrate of the present disclosure, the first switch unit is provided between the gate line and the test pad, and the gate line is always electrically isolated from the test pad when the first switch unit is deactivated. In normal display of a liquid crystal display panel, as long as the first switch unit is ensured in a deactivated state, electrical isolation can be ensured between the gate line and the test pad. This can prevent a screen from been affected by an additional load, which would otherwise cause abnormal display of a picture. Thus, display quality of the liquid crystal display panel can be ensured. At the same time, since the gate line is connected to the test pad through the first switch unit, a GOA region to which the gate line belongs will not be affected by static electricity generated at the test pad during a manufacturing procedure of the array substrate, thereby preventing the GOA region from explosive wound due to static electricity.

As a further improvement of the present disclosure, the first switch unit includes a first thin film transistor, which has a first end connected to the gate line, a second end connected to the test pad, and a gate connected to the control terminal, wherein the first end is one of a source and a drain of the first thin film transistor, and the second end is the other one of the source and the drain of the first thin film transistor.

When the thin film transistor, a common electronic device, is used as a switch unit, not only a required function can be achieved at relatively low costs, hut, depending on the nature of the thin film transistor, the source and the drain of the thin film transistor are also unnecessary to be strictly distinguished during a circuit fabrication process, thereby further improving production efficiency of a circuit board.

As a further improvement of the present disclosure, the first switch unit further includes a second switch unit, by means of which the gate of the first thin film transistor is connected to the control terminal.

Control of activation and deactivation of the first thin film transistor is more convenient and flexible by the second switch unit than by the gate of the first thin film transistor directly.

As a further improvement of the present disclosure, the second switch unit is a second thin film transistor, which has a third end connected to the gate of the first thin film transistor, a gate connected both to a fourth end and to the control terminal, wherein the third end is one of a source or a drain of the second thin film transistor, and the fourth end is the other one of the source and the drain of the second thin film transistor.

As a further improvement of the present disclosure, the second switch unit comprises a plurality of cascaded second thin film transistors, wherein each second thin film transistor has a gate and a fourth end connected to each other and to a third end of an adjacent second thin film transistor; a head second thin film transistor has a third end connected to the gate of the first thin film transistor; and a tail second thin film transistor has a gate and a fourth end connected to each other and to the control terminal, and wherein the third end is one of a source or a drain of the second thin film transistor, and the fourth end is the other one of the source and the drain of the second thin film transistor.

The activation and deactivation of the first thin film transistor can also be controlled by the plurality of cascaded second thin film transistors, and a different control connection manner is provided herein.

As a further improvement of the present disclosure, the control terminal is connected to a first voltage output terminal in a drive circuit on the array substrate through an electrical lead, and under an action of a first voltage, the first switch unit is deactivated.

Since the control terminal is directly connected to the first voltage output terminal on the array substrate, and the first voltage is always present at the first voltage output terminal during normal display of the liquid crystal display panel, it can be ensured that the first switch unit is in a deactivated state. This ensures electrical isolation of the gate line from the test pad, thereby preventing the screen from being affected by an additional load, which would otherwise cause abnormal display of a picture. Thus, display quality of the liquid crystal display panel can be ensured. Further, when the control terminal is directly connected to the first voltage output terminal in the drive circuit on the array substrate, it is no longer necessary to introduce the first voltage from the outside, and the first voltage output terminal closest to the thin film transistor can be selected. Thus, a connection line can be provided shorter, thereby facilitating design of the circuit, and saving a wiring space.

The present disclosure meanwhile provides a method for testing a gate line of an array substrate, comprising using the above circuit to test the gate line, wherein the method includes the steps of:

applying a first voltage to a control terminal of the first switch unit, such that the first switch unit is deactivated and the gate line is in normal operation; and applying, when the array substrate is in abnormal operation, a second voltage to the control terminal of the first switch unit, under an action of which, the first switch unit is activated, such that an output signal of the gate line is tested by means of the test pad.

Under the action of the first voltage, the gate line is isolated from the test pad, so that normal display of the liquid crystal display panel will not be affected. When abnormal display is presented, the second voltage can be applied to the control terminal to activate the first switch unit, i.e., the test pad and the gate line are electrically connected to each other, such that the output signal of the gate line can be detected by the test pad.

As a further improvement of the present disclosure, the control terminal is connected to the first voltage output terminal through an electrical lead, such that the first voltage can be applied to the control terminal.

Further, the first voltage output terminal is provided by the drive circuit on the array substrate. In this way, it is no longer necessary to introduce the first voltage from the outside.

Further, the connection between the control terminal and the first voltage output terminal is turned off, and an external second voltage is connected to a first control terminal. In one preferred embodiment, the connection between the control terminal and the first voltage output terminal is turned off by means of laser breakdown. Laser breakdown can quickly and accurately turn off the connection between the control terminal and the first voltage output terminal, so that peripheral circuits will not be affected.

To conclude the above, according to the circuit for testing the gate line of the array substrate of the present disclosure, because the first switch unit is provided between the gate line and the test pad, it is possible to ensure that the gate line and the test pad are always isolated from each other when the gate line is not being tested. In this way, in a manufacturing procedure of the array substrate, a GOA region to which the gate line belongs will not be affected by static electricity generated at the test pad, thereby avoiding electrostatic damage to the GOA region. At the same time, in a display procedure of the liquid crystal display panel, because the gate line and the test pad are electrically insulated from each other, abnormal display of a picture caused by an additional load on the screen can be avoided, thereby ensuring display quality of the liquid crystal display panel. Meanwhile, when the liquid crystal display panel cannot be lit, the external second voltage can be introduced to the first switch unit, to enable the test pad to be connected to the gate line. Thus, the gate line can be tested by means of the test pad, so as to better find a cause of the problem. As a result, reoccurrence of a same problem can be prevented, thereby facilitating subsequent improvement of a product.

BRIEF DESCRIPTION OF THE DRAWINGS

The present disclosure will be explained in more detail with reference to embodiments and accompanying drawings, in which.

In the accompanying drawings, the same components are indicated by the same reference signs. The accompanying drawings are not drawn to actual scale.

DETAILED DESCRIPTION OF THE EMBODIMENTS

The following description will be made in detail with reference to the accompanying drawings, in which, the terms "upper," "lower," "left," and "right" are in relation to an illustrated direction and are not to be construed as limitations of the disclosure.

Figure 1:
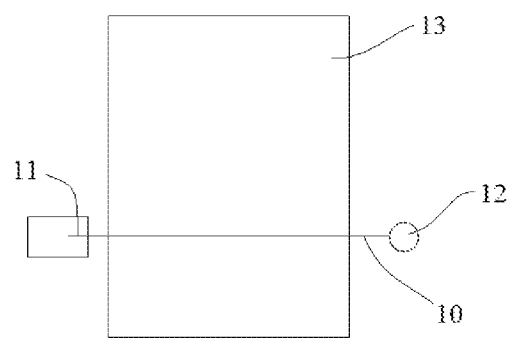
FIG. 1 schematically shows a circuit for testing a gate line of an array substrate in the prior art.
Figure 2:
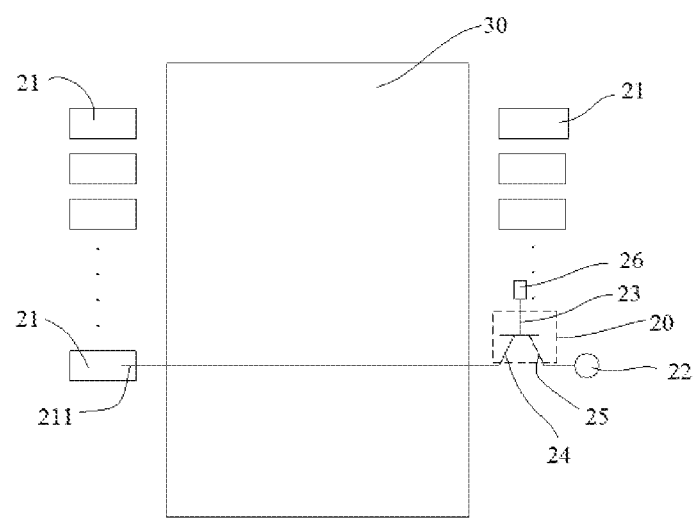
FIG. 2 schematically shows a circuit for testing a gate line of an array substrate according to the present disclosure.

As shown in FIG. 2, in a circuit for testing a gate line of an array substrate of the present disclosure, a gate line 211 is connected to a test pad 22 through a first switch unit 20, and one end of the first switch unit 20 is connected to a control terminal 26. A voltage is applied to the control terminal 26 to control activation and deactivation of the first switch unit 20. The gate line 211 is able to operate normally when the first switch unit 20 is deactivated, and when the first switch unit 20 is activated, the test pad 22 is used to introduce a signal of the gate line 211, so as to detect an output signal of the gate line 211.

Embodiment 1

FIG. 2 schematically shows a circuit for testing a gate line of an array substrate according to Embodiment 1 of the present disclosure. As can be seen from FIG. 2, a plurality of circuits are provided on both sides of a display region 30 of the array substrate, and these circuits include a plurality of GOA units 21, each of which has one gate line 211. Of course, when the gate lines 211 are being tested, since these GOA units 21 are constituted by identical circuits, it is unnecessary to test the gate lines 211 in all the GOA units 21. Typically, two to four gate lines 211 are selected for testing, and the number of test pads 22 used corresponds to the number of the gate lines selected for test.

In FIG. 2, the first switch unit 20 provided between the GOA unit 21 and the test pad 22 includes a first thin film transistor, which has a gate 23 connected to the control terminal 26, and a first end 24 and a second end 25 connected to the gate line 211 and the test pad 22 in the GOA unit 21, respectively. Herein, the first end 24 is one of a source and a drain of the first thin film transistor, and the second end 25 is the other one of the source and the drain of the first thin film transistor. That is, if the first end 24 is the source, then the second end 25 is the drain, while if the first end 24 is the drain, then the second end 25 is the source.

A voltage can be applied to the control terminal 26, i.e., the gate 23, to control activation and deactivation of the first end 24 and the second end 25. When a first voltage is applied to the control terminal 26, the first end 24 and the second end 25 are in a deactivated state, such that the gate line 211 and the test pad 22 are in an electrically isolated state. When a liquid crystal display panel is in normal display, the gate line 211 and the test pad 22 are electrically isolated as long as it can be ensured that the first voltage is applied to the control terminal 26. Thus, the gate line 211 can operate normally, and display abnormality of a picture caused by an additional load on the screen can meanwhile be avoided, thereby ensuring display quality of the liquid crystal display panel. In a manufacturing procedure of the array substrate, since the first thin film transistor is provided between the gate line 211 and the test pad, the GOA region to which the gate line belongs will not be affected by static electricity generated at the test pad, thereby protecting the GOA region from explosive wound caused by static electricity.

In the present embodiment, it is preferred that the control terminal 26 is connected to a first voltage output terminal in a drive circuit on the array substrate through an electrical lead. Thus, when the liquid crystal display panel is normal operation, since the first voltage output terminal constantly outputs a first voltage, it can be ensured that the first terminal voltage is constantly applied to the control terminal 26, thereby ensuring electrical isolation of the gate line 211 from the test pad 22. The gate line 211 can thus operate normally. When the control terminal 26 is directly connected to the first voltage output terminal in the drive circuit on the array substrate, it will be unnecessary to introduce the first voltage externally. And the first voltage output terminal closest to the control terminal 26 can be selected, thereby reducing length of a connection line, facilitating a design of the circuit, and saving a wiring space.

When the liquid crystal display panel cannot be lit, it is necessary to introduce a second voltage to the control terminal 26. The first end 24 and the second end 25 are activated under the action of the second voltage, so that the gate line 211 and the test pad 22 are activated. Thus, a signal output from the gate line 211 can be tested by the test pad 22. In the present embodiment, the second voltage is introduced from the outside, before which the electrical lead between the control terminal 26 and the first voltage output terminal is cut off. Preferably, the electrical lead is cut off by means of laser breakdown, to avoid affecting peripheral circuits. Subsequently, the external second voltage is introduced to the control terminal 26, under an action of which, the test pad 22 and the gate line 211 are turned on, and the signal output from the gate line 211 can be tested by the test pad 22.

When the first thin film transistor in the present embodiment is an N-type thin film transistor, the first voltage is a low level signal, preferably in the range from −10 to −4 $V_1$ while when the first thin film transistor is a P-type thin film transistor, the first voltage is a high level signal, preferably in the range from 4 to 10 V.

Embodiment 2

Figure 3A:
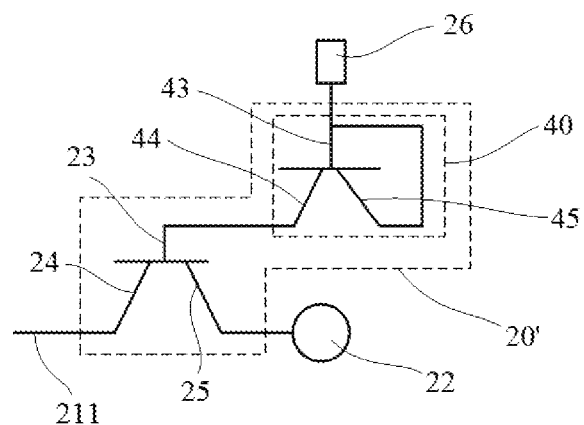
FIG. 3 schematically shows a circuit according to a second embodiment of the present disclosure.

FIG. 3a schematically shows a circuit for testing a gate line of an array substrate according to Embodiment 2 of the present disclosure. Unlike Embodiment 1, in the present embodiment, a first switch unit 20' further includes a second switch unit 40, and the gate 23 of the first thin film transistor is connected to the control terminal 26 through the second switch unit 40. The second switch unit 40 in the present embodiment includes a second thin film transistor, which has a third end 44 connected to the gate 23 of the first thin film transistor, a fourth end 45 and a gate 43 first connected to each other and then connected to the control terminal 26 together. Herein, the third end 44 is one of a source and a drain of the second thin film transistor, and the fourth end 45 is the other one of the source and the drain of the second thin film transistor. That is, if the third end 44 is the source, then the fourth end 45 is the drain, while if the third end 44 is the drain, then the fourth end 45 is the source. Herein, the second thin film transistor and the first thin film transistor are of a same type, i.e., the second thin film transistor and the first thin film transistor are both P-type thin film transistors or both N-type thin film transistors.

When the first voltage is applied to the control terminal 26, the third end 44 and the fourth end 45 of the second thin film transistor are cut off, such that the gate 23 of the first thin film transistor is electrically isolated from the control terminal 26. When the first thin film transistor is deactivated, the first end 24 is cut off from the second end 25, and the gate line 211 is electrically isolated from the test pad 22. When the second voltage is applied to the control terminal 26, the third end 44 and the fourth end 45 of the second thin film transistor are turned on, so that the gate 23 of the first thin film transistor is electrically connected to the control terminal 26. When the first thin film transistor is turned on, the first end 24 and the second terminal 25 are turned on, and the gate line 211 is electrically connected to the test pad 22.

Embodiment 3

Figure 3B:
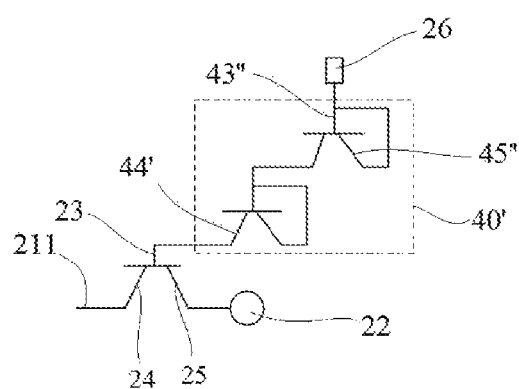

FIG. 3b schematically shows a circuit for testing a gate line of an array substrate according to Embodiment 3 of the present disclosure. Unlike Embodiment 2, in the present embodiment, a second switch unit 40' includes a plurality of cascaded second thin film transistors. FIG. 3b shows the second switch unit 40' formed by two cascaded second thin film transistors.

In FIG. 3b, each of the second thin film transistors in the second switch unit 40' has a gate and a fourth end that are connected to each other and sequentially connected to a drain of an adjacent second thin film transistor. Ahead second thin film transistor has a third end 44' connected to the gate 23 of the first thin film transistor, and a tail second thin film transistor has a gate 43" connected to a fourth end 45" and to the control terminal 26. Herein, the third end 44' is one of a source and a drain of the second thin film transistor, and the fourth end 45" is the other one of the source and the drain of the second thin film transistor. That is, if the third end 44' is the source, then the fourth end 45" is the drain, while if the third end 44' is the drain, then the fourth end 45" is the source.

A voltage is applied to the control terminal 26 to control activation and deactivation of the second switch unit 40', so as to control activation and deactivation of the first thin film transistor. When a first voltage is applied to the control terminal 26, the second switch unit 40' is deactivated, i.e., the gate 23 of the first thin film transistor is electrically isolated from the control terminal 26. As a result, the first thin film transistor is turned off, i.e., the first end 24 is cut off from the second end 25, and the gate line 211 is electrically isolated from the test pad 22. When a second voltage is applied to the control terminal 26, the second switch unit 40' is activated, so that the first film transistor is activated, i.e., the first end 24 is electrically connected to the second end 25, and the gate line 211 is electrically connected to the test pad 22.

Figure 3C:
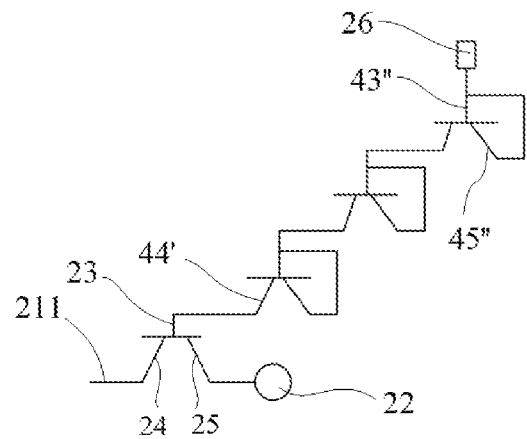

FIG. 3c schematically shows connection when the second switch unit is formed by three cascaded second thin film transistors. FIG. 3c shows more clearly a cascade relationship of the second thin film transistor in the second switch unit. As can be seen from FIG. 3c, the gate and the fourth terminal of each second thin film transistor are connected to each other and to the third end of the adjacent second thin film transistor in turn. The third end 44' of the head second thin film transistor is connected to the gate 23 of the first thin film transistor, and the gate 43" of the tail second thin film transistor is connected to the fourth end 45' and to the control terminal 26.

A voltage is applied to the control terminal 26, to control activation and deactivation of the second switch unit, so as to control activation and deactivation of the first end 24 and the second end 25 of the first thin film transistor, thereby achieving control of electrical isolation or electrical connection between the gate line 211 and the test pad 22.

Embodiment 4

Figure 4:
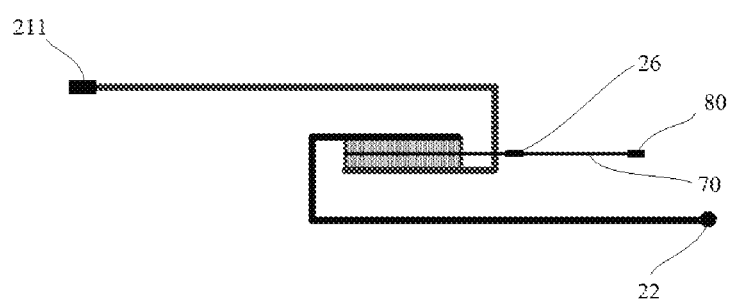
FIG. 4 schematically shows a wiring structure of the circuit as shown in FIG. 2 at a first thin film transistor.

FIG. 4 schematically shows a wiring structure at the first thin film transistor of Embodiment 1. The gate line 211 and the test pad 22 are electrically connected to the source and the drain of the first thin film transistor, respectively, and the control terminal 26 is connected to a first voltage output terminal 80 through an electrical lead 70.

Figure 5:
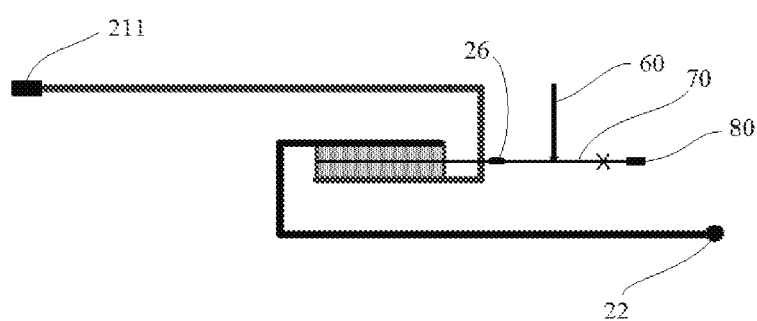
FIG. 5 schematically shows a method for testing a gate line of an array substrate according to the present disclosure.

FIG. 5 schematically shows application of an external second voltage. When the liquid crystal display panel cannot be lit, it is necessary to measure an output waveform of the gate line by the test pad. Since the control terminal 26 and the first voltage output terminal 80 are connected to each other by the electrical lead 70, it is necessary to cut off the electrical lead 70 between the control terminal 26 and the first voltage output terminal before introduction of the external second voltage. Preferably, the electrical lead 70 is broken by means of laser breakdown, so as to prevent peripheral circuits from being affected. Subsequently, an external second voltage 60 is introduced to the control terminal 26, under the action of which, the test pad 22 and the gate line 211 are turned on. The signal output from the gate line 211 is tested by the test pad 22, to find out a reason as to why the liquid crystal display panel cannot be lit, so as to avoid reoccurrence of a same problem, and to facilitate subsequent improvement of product quality.

It is to be understood that the above embodiments are merely illustrative but not restrictive of the technical solutions of the present disclosure. Although the present disclosure has been described in detail with reference to preferred embodiments, it will be understood by those of ordinary skill in the art that the technical solutions of the present disclosure can be modified or replaced with equivalents thereof, within the spirit and scope of the present disclosure, which is set forth in the scope of the claims of the present disclosure.

The invention claimed is:

1. A circuit for testing a gate line of an array substrate, comprising:
   a test pad; and
   a first switch unit which connects the test pad and the gate line and has an end connected to a control terminal,
   wherein a voltage is applied to the control terminal to control activation and deactivation of the first switch unit, and
   wherein the gate line is in normal operation when the first switch unit is deactivated, and the test pad tests an output signal of the gate line when the first switch unit is activated;
   wherein the first switch unit includes a first thin film transistor, which has a first end connected to the gate line, a second end connected to the test pad, and a gate connected to the control terminal, wherein the first end is one of a source and a drain of the first thin film transistor, and the second end is the other one of the source and the drain of the first thin film transistor;
   the first switch unit further includes a second switch unit, by means of which the gate of the first thin film transistor is connected to the control terminal;
   wherein the second switch unit comprises a plurality of cascaded second thin film transistors,
   wherein each second thin film transistor has a gate and a fourth end connected to each other and to a third end of an adjacent second thin film transistor in turn; a head second thin film transistor has a third end connected to the gate of the first thin film transistor; and a tail second thin film transistor has a gate and a fourth end connected to each other and to the control terminal, and
   wherein the third end is one of a source or a drain of the second thin film transistor, and the fourth end is the other one of the source and the drain of the second thin film transistor.

2. The circuit according to claim 1, wherein the control terminal is connected to a first voltage output terminal in a drive circuit on the array substrate through an electrical lead, and under an action of a first voltage, the first switch unit is deactivated.

3. A method for testing a gate line of an array substrate, comprising using a circuit to test the gate line,
   wherein the circuit includes:
   a test pad; and
   a first switch unit which connects the test pad and the gate line and has an end connected to a control terminal,
   wherein a voltage is applied to the control terminal to control activation and deactivation of the first switch unit, and
   wherein the gate line is in normal operation when the first switch unit is deactivated, and the test pad tests an output signal of the gate line when the first switch unit is activated; and
   wherein the method includes the steps of:

applying a first voltage to a control terminal of the first switch unit of the circuit, such that the first switch unit is deactivated and the gale line is in normal operation; and applying, when the array substrate is in abnormal operation, a second voltage to the control terminal of the first switch unit of the circuit, under an action of which, the first switch unit is activated, such that an output signal of the gate line is tested by means of the test pad;

wherein the first switch unit includes a first thin film transistor, which has a first end connected to the gate line, a second end connected to the test pad, and a gate connected to the control terminal, wherein the first end is one of a source and a drain of the first thin film transistor, and the second end is the other one of the source and the drain of the first thin film transistor;

the first switch unit further includes a second switch unit, by means of which the gate of the first thin film transistor is connected to the control terminal;

the second switch unit comprises a plurality of cascaded second thin film transistors, wherein each second thin film transistor has a gate and a fourth end connected to each other and to a third end of an adjacent second thin film transistor in turn; a head second thin film transistor has a third end connected to the gate of the first thin film transistor; and a tail second thin film transistor has a gate and a fourth end connected to each other and to the control terminal, and wherein the third end is one of a source and a drain of the second thin film transistor, and the fourth end is the other one of the source and the drain of the second thin film transistor.

4. The method according to claim 3, wherein the control terminal is connected to a first voltage output terminal in a drive circuit on the array substrate through an electrical lead, and under an action of a first voltage, the first switch unit is deactivated.

5. The method according to claim 3, wherein the control terminal is connected to a first voltage output terminal through an electrical lead, so as to apply the first voltage to the control terminal.

6. The method according to claim 5, wherein the first voltage output terminal is supplied by a drive circuit on the array substrate.

7. The method according to claim 5, wherein connection between the control terminal and the first voltage output terminal is turned off, and an external second voltage is applied to a first control terminal.

8. The method according to claim 6, wherein connection between the control terminal and the first voltage output terminal is turned off, and an external second voltage is applied to a first control terminal.

* * * * *